United States Patent
Komoro et al.

(12)

(10) Patent No.: US 6,947,090 B2
(45) Date of Patent: Sep. 20, 2005

(54) MICROMINIATURE IMAGE PICKUP DEVICE

(75) Inventors: Atsushi Komoro, Ibaraki (JP); Tomokazu Yamashita, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 581 days.

(21) Appl. No.: 09/941,004

(22) Filed: Aug. 28, 2001

(65) Prior Publication Data

US 2004/0218084 A1 Nov. 4, 2004

(30) Foreign Application Priority Data

Aug. 30, 2000 (JP) ........................ 2000-261654

(51) Int. Cl.⁷ .............................................. H04N 5/225
(52) U.S. Cl. ........................................ 348/340; 348/65
(58) Field of Search ............................ 348/76, 45, 65, 348/72, 75, 87, 340, 335; 361/761

(56) References Cited

U.S. PATENT DOCUMENTS

| | | | | |
|---|---|---|---|---|
| 5,418,566 A | * | 5/1995 | Kameishi ...................... | 348/294 |
| 5,875,100 A | * | 2/1999 | Yamashita .................. | 361/764 |
| 6,275,255 B1 | * | 8/2001 | Adair et al. .................. | 348/76 |
| 6,445,591 B1 | * | 9/2002 | Kwong ....................... | 361/761 |
| 6,459,593 B1 | * | 10/2002 | Kwong ....................... | 361/761 |
| 6,554,765 B1 | * | 4/2003 | Yarush et al. ............... | 600/132 |

* cited by examiner

*Primary Examiner*—Tuan Ho
*Assistant Examiner*—Yogesh K. Aggarwal
(74) *Attorney, Agent, or Firm*—William B. Kempler; W. James Brady, III; Frederick J. Telecky, Jr.

(57) ABSTRACT

A microminiature CCD image pickup device with a shortened length that can be applied to an electronic medical endoscope or the like. Microminiature CCD image pickup device (1) has optical glass (11), CCD chip (12), and stacked circuit board (15) that are disposed in that order along its length orientation. It further has TAB tape (13) that connects CCD chip (12) and the electronic circuits mounted on stacked circuit board (15). Stacked circuit board (15) is formed with insulated circuit board in which are packaged electronic circuits, including their wiring pattern, stacked in stacked layers in the diametral direction perpendicular to said length orientation, and has at least one cavity (153) formed as an indention in the diametral direction. At least one miniature chip component (16) is mounted in cavity (153), and at least one chip component (17) is mounted on the surface of stacked circuit board (15) over cavity (153). The electronic circuits are stacked in stacked circuit board (15) and chip components (16) and (17) are disposed in the diametral direction, so that the length of microminiature CCD image pickup device (1) is shortened.

17 Claims, 1 Drawing Sheet

MICROMINIATURE IMAGE PICKUP DEVICE

FIELD OF THE INVENTION

This invention pertains to an image pickup device that uses a charge coupled device (CCD), such as is used for the tip of an electronic medical endoscope, for example. Specifically, it pertains to a microminiature image pickup device in which the dimension in the length direction is shortened.

BACKGROUND OF THE INVENTION

An example of a microminiature CCD image pickup device used as an ultrasmall image pickup device for an electronic medical endoscope is shown.

Microminiature CCD image pickup devices used for electronic medical endoscopes have been made as small as possible in order to reduce pain to which the patient is subjected from swallowing the microminiature CCD image pickup device when a patient's stomach is to be examined, for example.

To try such miniaturization, the external dimensions of the tip part of the microminiature CCD image pickup device may be miniaturized and the length of the microminiature CCD image pickup device may be shortened. Miniaturizing the external dimensions and shortening the length will both promote ease of guiding when the microminiature CCD image pickup device passes through a passage from the patient's mouth, e.g., the esophagus leading to the stomach, and will reduce physical pain to the patient. Furthermore, miniaturization of the microminiature CCD image pickup device makes it possible to increase the degree of freedom of operation in the stomach to be examined, contributes to improving the results of the examination, and reduces physical pain to the examined patient.

A microminiature CCD image pickup device used for an electronic medical endoscope, for example, as illustrated in FIG. 3, has optical glass (21), CCD chip (22), ceramic (28), lead (29), and insulated circuit board (25) disposed side by side in the length direction of the microminiature CCD image pickup device as shown.

An electronic circuit for signal processing, for example, chip components (26) and (27) with transistors, capacitors, or the like, are mounted on insulated circuit board (25) to make it possible to process the image pickup output produced by CCD chip (22) as signals and send them outside of the patient.

A power feed wire for supplying power to drive CCD chip (22) from the outside is also accommodated in insulated circuit board (25).

TAB (Tape Automated Bonding) tapes (23) and (24) are disposed between CCD chip (22) and lead (29) and connect the electrode of CCD chip (22) and wiring patterns formed in lead (29).

TAB tapes (23) and (24) further perform the role of power feed wires that feed power to CCD chip (22).

Here, only one TAB tape, for example, only TAB tape (23), would be sufficient. As shown in the figure, more than one can also be furnished, e.g., TAB tape (24) in addition to TAB tape (23).

Lead (29) is soldered to the wiring patterns formed on CCD chip (22) and the surface of insulated circuit board (25) via TAB tape (23). It is furnished to connect first chip component (26) and second chip component (27) mounted on insulated circuit board (25).

In this way, in the microminiature CCD image pickup device (2) shown in FIG. 3, CCD chip (22) and insulated circuit board (25) are connected by TAB tape (23) and lead (29).

The external surface of microminiature CCD image pickup device (2) is treated so that, even if these components of microminiature image pickup device (2) touch the lining of the patient's esophagus or the stomach wall, they will not be damaged.

Note that, in order to illuminate the part examined, e.g., the inside of the stomach, light is applied from the outside via an optical fiber, for example, to the microminiature CCD image pickup device, but the lighting instrument is not directly related to this invention, so it is omitted from the figure.

A cable (not shown) that will guide microminiature CCD image pickup device (2) to the lining of the esophagus and that is flexible with a certain degree of strength is connected to microminiature CCD image pickup device (2) that is constituted in this way.

A power feed wire that supplies power to CCD chip (22), an optical fiber for lighting, and a signal transmission wire, for example, an optical fiber, for carrying image signals picked up by CCD chip (22) outside of the patient are housed inside that cable.

For example, when microminiature CCD image pickup device (2) reaches the inside of the patient's stomach, the part of the stomach examined will be lighted by the illumination instrument, not shown, the imaging results from CCD chip (22) are carried out as electrical signals, and the signals are processed via TAB tape (23) and lead (29) by chip components (26) and (27) mounted on insulated circuit board (25) and that perform signal processing. The results are carried outside the patient via the cable and are output to the display device of the main unit of the electronic medical endoscope.

In microminiature CCD image pickup device (2) illustrated in FIG. 3, insulated circuit board (25) on which chip components (26) and (27) are mounted is manually soldered to lead (29). The problem has been that a manual operation is required, and on top of that, the processing time is long.

Furthermore, first chip component (26) and second chip component (27) are disposed side by side in the length direction on insulated circuit board (25), making the insulated circuit board (25) longer. As a result, there has been a limit to the reduction of length L1 of microminiature CCD image pickup device (2). Only two chip components are shown in FIG. 3, but when the number of chip components becomes larger, microminiature CCD image pickup device (2) will become longer in the length direction in accordance with that number.

Thus, the purpose of this invention is to provide a microminiature image pickup device where the microminiature CCD image pickup device can be shortened in the length direction.

Another purpose of this invention is to provide a microminiature image pickup device for which operations, e.g., assembly processing, can be reduced, and processing time can be shortened.

SUMMARY OF INVENTION

In order to accomplish the aforementioned purposes, the microminiature image pickup device of this invention is a microminiature image pickup device that has an image pickup element, optical glass furnished on the front surface of said image pickup element, a stacked circuit board that is furnished on the rear surface of said image pickup element and that has a wiring pattern, and a connection member that electrically connects said image pickup element and the wiring pattern of said stacked circuit board. Said stacked circuit board is formed with insulated circuit boards, in which are packaged electronic circuits, including wiring patterns, stacked in multiple layers in the diametral direction perpendicular to the lengthwise orientation of the microminiature image pickup device, and it has a cavity formed as an indentation in the diametral direction thereof. A first electronic component is mounted in said cavity, and a second electronic component is mounted on the surface of said stacked circuit board.

Said image pickup device is ideally a CCD device.

Said connection member is ideally TAB tape.

If the microminiature image pickup device is constituted in this way, it will be possible for the first electronic component and the second electronic component to be disposed in positions where they are stacked in the diametral direction perpendicular to the lengthwise orientation of the microminiature image pickup device, so that the microminiature image pickup device can be shortened in the length direction.

Furthermore, electronic circuits that include a wiring pattern are packaged stacked in the diametral direction perpendicular to the lengthwise orientation, so that the microminiature image pickup device can be shortened in the length direction even more. Here, existing electronic circuit packaging technology can be applied as the packaging technology for stacking such electronic circuits.

In addition, the electrical connection between the electrode of the image pickup device, e.g., CCD, and the stacked circuit board is accomplished with a connection member, e.g., TAB tape, and a soldered lead as used in the past is not required. Thus processing will be simple and the assembly processing time can also be reduced.

Ideally, the first electronic component mounted in the aforementioned cavity connected to a wiring pattern formed on the bottom surface of said cavity.

Ideally, the first electronic component mounted in said cavity is connected to a wiring pattern formed on the bottom surface of said cavity in a bare chip state.

Figure 1A:
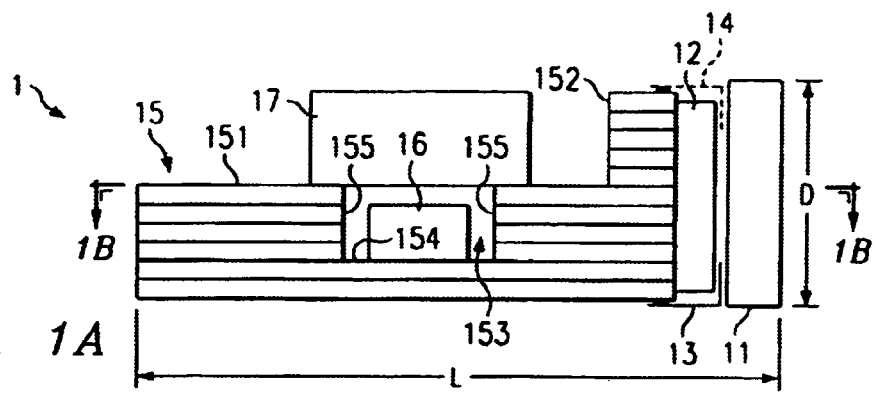
FIG. 1(A) is a cross section and FIG. (B) is a plan view.

REFERENCE NUMBERALS AND SYMBOLS AS SHOWN IN THE DRAWINGS 1, 1A Microminiature CCD image pickup device
11 Optical glass
12 CCD chip
13, 14 TAB tape
15 Stacked circuit board
151 Low flat part
152 High part
153 Cavity,
154 Bottom surface of cavity
155 Cavity wall surface
16, 17 Chip component
18 Electrical connection surface,
19 Bare chip,
2 Microminiature CCD image pickup device,
21 Optical glass,
22 CCD chip,
23, 24 TAB tape
25 Insulated circuit board,
26, 27 Chip component
28 Ceramic
29 Lead.

DESCRIPTION OF EMBODIMENT

Embodiments of the microminiature image pickup device of this invention are discussed below, with reference to the accompanying figures.

Here, a microminiature CCD image pickup device, using a CCD device such as is used for the tip of an electronic medical endoscope, is discussed as an embodiment of the microminiature image pickup device of this invention.
Embodiment 1

A microminiature CCD image pickup device that is a first embodiment of this invention will be discussed, with reference to FIGS. 1(A) and (B).

Figure 1B:
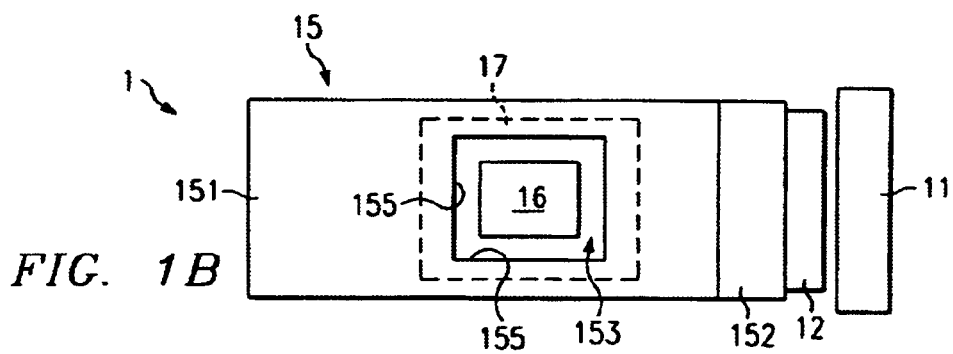
FIG. 1 shows the constitution of a first embodiment of a microminiature CCD image pickup device of this invention.

FIG. 1(A) is a side view of microminiature CCD image pickup device (1) and FIG. 1(B) is a top view.

Microminiature CCD image pickup device (1) has optical glass (11), CCD chip (12), and stacked circuit board (15) disposed along its length direction.

The inner surface of optical glass (11) and one surface of CCD chip (12) touch, and the other surface of CCD chip (12) touches the side surface of stacked circuit board (15).

TAB (Tape Automated Bonding) tape (13), which is known in semiconductor device packaging technology, is connected to the electrode of CCD chip (12) and the wiring pattern of stacked circuit board (15). Drive power is supplied from the outside to CCD chip (12), enabling CCD chip (12) to operate. The signals comprising the image pickup output from CCD chip (12) are transmitted to stacked circuit board (15).

The connection of TAB tape (13) to CCD chip (12) is accomplished by soldering, for example. In the same way, the connection of TAB tape (13) to stacked circuit board (15) is accomplished by soldering to the wiring pattern formed on the surface of stacked circuit board (15).

Second TAB tape (14) can also be furnished, as indicated by the dotted line, in addition to TAB tape (13), as necessary.

In stacked circuit board (15), multiple insulated boards, in which electronic circuits (electronic components), including wiring patterns, are packaged, are stacked integrally.

The electrical connections between the electronic components that are packaged in the multiple insulated boards are accomplished via conductive substances used to fill through-holes or the like, for example, that are known in semiconductor circuit technology.

For the insulated boards, it is easy to package electronic circuits that are thin films, have a high insulating capability, have high mechanical strength, and include a wiring pattern, and boards with good heat radiation characteristics are preferable. Ceramic substrates, for example, are preferable as such insulated boards.

The electronic circuits (electronic components) packaged in the insulated boards include electronic components that are not very bulky in the height dimension, for example, printed wiring patterns (conducting patterns), thin-film capacitors, and thin-film resistor elements. These electronic circuits pre-process the image pickup signals at CCD chip (12) and then guide them to miniature chip component (16) and large chip component (17).

Other components packaged in the insulated boards include a printed wiring pattern for supplying drive power to CCD chip (12) from the outside.

Stacked circuit board (15) of this embodiment is constituted of high part (152) on the side that touches CCD chip (12), and low flat part (151).

Cavity (153) is formed in low flat part (151). Packaged inside cavity (153) is chip component (16), in which is housed an electronic circuit, for example, a transistor or a large capacitor, that processes the image pickup signals from CCD chip (12) and outputs them outside the patient to the electronic medical endoscope via a cable.

Chip component (16) is electrically connected directly to the wiring pattern formed on cavity bottom surface (154). Chip component (16) is separate from cavity wall surface (155), After chip component (16) is assembled in cavity (153), the cavity is filled with an insulating filler, for example, epoxy resin.

Chip component (17), which comprises a large electronic component that houses an electronic circuit, for example, a transistor or a relatively large capacitor, and/or houses multiple electronic components that work with chip component (16) to process the image pickup signals from CCD chip (12) and output them outside the patient via a cable to the electronic medical endoscope, is assembled on the surface of low flat part (151) in the position above chip component (16) so as to cover cavity (153) with its intervening insulating filler.

As the mounting method for this chip component (17), it is electrically connected directly to the wiring pattern formed on the surface of low flat part (151).

To compare the dimensions of chip component (16) and chip component (17), the planar dimensions of chip component (17) are larger than the planar dimensions of chip component (16). Thus, in this specification, chip component (16) is called miniature chip component (16) and chip component (17) is called large chip component (17).

In this embodiment, for example, large chip component (17) is a capacitor that is 0.8 mm high, 0.8 mm wide, and 1.6 mm long (size 1608). Miniature chip component (16), for example, is a microelectronic component that is 0.5 mm high, 0.5 mm wide, and 1.0 mm long (size 1005) or 0.3 mm high, 0.3 mm wide, and 0.6 mm long (size 0603).

These components of the illustrated microminiature CCD image pickup device (1) are integrated, and the external surface of microminiature CCD image pickup device (2) is treated so that they will not be damaged even if they touch the lining of the patient's esophagus or the stomach wall.

A transmission wire that is connected to the electronic medical endoscope and a power feed wire for CCD chip (12) are housed in stacked circuit board (15). A flexible guide cable with a certain degree of strength, which is constituted to protect the patient's esophagus, connects to stacked circuit board (15).

In the guide cable are housed a power feed wire for feeding power to CCD chip (12) from the electronic medical endoscope on the outside, an optical fiber that carries light from the lighting instrument of the electronic medical endoscope to the tip of microminiature CCD image pickup device (1), and a signal transmission line, for example, an optical fiber or conductive wire, for carrying to the electronic medical endoscope on the outside the results of processing the image pickup signal from CCD chip (12) by stacked circuit board (15).

When microminiature CCD image pickup device (1) is used to examine the inside of the stomach, illuminating light from the electronic medical endoscope on the outside is carried by the optical fiber and the region near the tip of microminiature CCD image pickup device (1) is illuminated. Image pickup is usually performed by means of this light, but the lighting means is not directly related to this invention, so an illustration and description are omitted.

For example, when microminiature CCD image pickup device (1) that is guided by a flexible guide cable passes through the patient's esophagus and reaches the stomach, light from the lighting instrument of the electronic medical endoscope is carried by the optical fiber to light up the inside of the stomach. The imaging results from CCD chip (12) are carried to stacked circuit board (15) via TAB tape (13) and reach miniature chip component (16) and large chip component (17) via the wiring patterns and electronic circuits of stacked circuit substrate (15). The desired signal processing is performed in these chip components (16) and (17), [the signals] are carried outside of the patient via the cable, and they are output to the display device of the main unit of the electronic medical endoscope.

Figure 3:
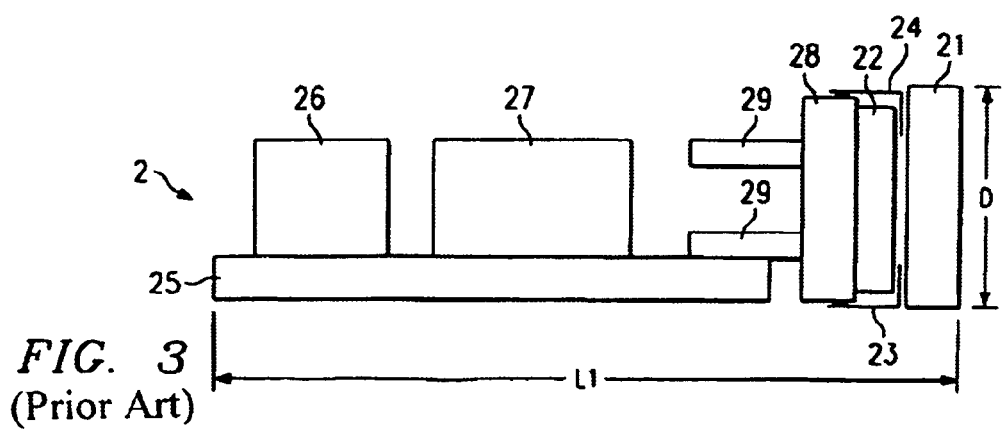
FIG. 3 is a cross section that shows the constitution of a conventional microminiature CCD image pickup device.

For microminiature CCD image pickup device (1) shown in FIGS. 1(A) and (B), the thin-film electronic components are incorporated into stacked circuit board (15) in which multiple insulated boards are stacked, so stacked circuit board (15) can be made shorter in the length direction than insulated circuit board (25) shown in FIG. 3.

In addition, with microminiature CCD image pickup device (1) shown in FIGS. 1(A) and (B), miniature chip component (16) and large chip component (17) are packaged in stacked ceramic circuit board (15) stacked on two levels in the diametral direction perpendicular to the lengthwise orientation of microminiature CCD image pickup device (1). Thus stacked circuit board (15) can be greatly shortened in the length direction compared to the length of insulated circuit board (25) shown in FIG. 3.

For example, length L1 of miniature CCD image pickup device (2) shown in FIG. 3 was 6.4 mm, but length L1 of microminiature CCD image pickup device (1) in the first embodiment in this application is 4.5 mm. It thus can be shortened about 2 mm (about 30%).

Furthermore, in microminiature CCD image pickup device (1), the connection of CCD chip (12) and the electronic circuits mounted (packaged) on stacked circuit board (15) is accomplished only with TAB tape (13), and the soldering operation involving lead (29) shown in FIG. 3 is not performed. As a result, assembly is easy, and the assembly processing time can also be significantly shortened.

The assembly operation for microminiature CCD image pickup device (1) of this invention with such a structure is suitable for automation.

Embodiment 2

A microminiature CCD image pickup device that is a second embodiment of this invention will be discussed with reference to FIG. 2.

Figure 2:
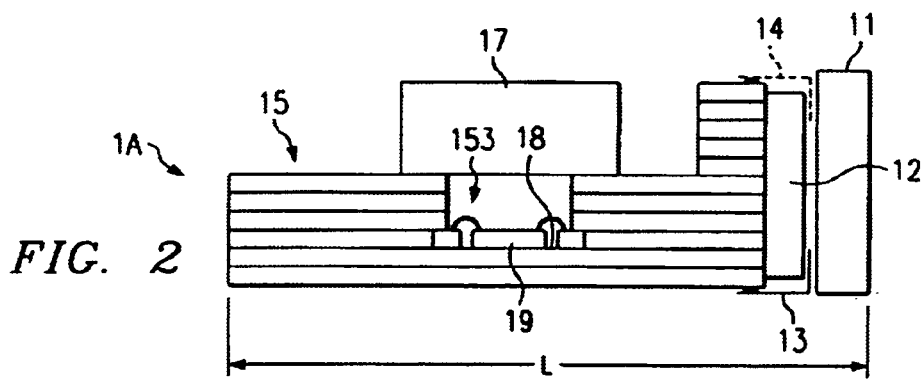
FIG. 2 is a cross section that shows the constitution of a second embodiment of a microminiature CCD image pickup device of this invention.

FIG. 2 is a cross section of microminiature CCD image pickup device (1A) that is a second embodiment of this invention.

Microminiature CCD image pickup device (1A) shown in FIG. 2 has optical glass (11), CCD chip (12), and stacked circuit board (15) disposed along its length direction. The constitution of these is the same as in the first embodiment.

Stacked circuit board (15) also has the same constitution as the first embodiment.

The electrical connection of CCD chip (12) and stacked circuit board (15) is also accomplished with TAB tape (13), in the same way as in the first embodiment.

In the second embodiment, the difference is that miniature chip component (16) in FIG. 1 is assembled on electrical connection surface (18) in cavity (153) as bare chip (19) that is well known as a semiconductor packaging technology. The space in cavity (153) is filled with an insulating filler, e.g., epoxy resin, after bare chip (19) is packaged.

The packaging method for large chip component (17) is the same as in the first embodiment.

With microminiature CCD image pickup device (1A) shown in FIG. 2, as in microminiature CCD image pickup device (1) in the first embodiment, wiring patterns and thin-film electronic components are incorporated into stacked circuit board (15) in which multiple insulated boards are stacked. So the length of stacked circuit board (15) in the length direction can be shortened.

Also with microminiature CCD image pickup device (1A) shown in FIG. 2, as in microminiature CCD image pickup device (1) in the first embodiment, miniature chip component (16) and large chip component (17) are packaged in stacked circuit board (15) stacked in two levels in the diametral direction perpendicular to the lengthwise orientation of microminiature CCD image pickup device (2). Thus stacked circuit board (15) can be shortened in the length direction.

Therefore the length of microminiature CCD image pickup device (1A) in the second embodiment can also be shortened, in the same way as in the first embodiment.

Microminiature CCD image pickup device (1A) in the embodiment also does not require a lead soldering operation, so the assembly processing time can be significantly shortened.

The assembly operation for microminiature CCD image pickup device (1A) in the second embodiment can also be automated.

In the above mentioned embodiments, only the major parts were described of a microminiature CCD image pickup device using a CCD chip as the image pickup element. Therefore, parts not directly related to this invention were omitted from the figures, but the microminiature image pickup device of this invention also includes such known parts, for example, a lighting instrument when the microminiature CCD image pickup device of the invention in this application is used for an electronic medical endoscope.

When the microminiature image pickup device of this invention is implemented, it is not limited to the abovementioned embodiments, and it will be evident to individuals skilled in the art that the details specified for the invention in this application, which are described in the claims of this specification, must be included.

For example, the microminiature image pickup device of the invention in this application need not be limited to application to an electronic medical endoscope. In cases where a miniature microminiature image pickup device is required, the microminiature image pickup device of the invention in this application can be applied in the same way as to an electronic medical endoscope.

An example of this invention has been given where a CCD chip (12) that is in wide use was used as the image pickup element, and where TAB tape (13) was used as the connection means, and where TAB tape (13) was used as the connection means, but of course this invention is not limited to such an example. Such circuits and other circuits that are essentially the same can of course also be applied.

With the microminiature image pickup device of this invention, the dimension in the length direction can be shortened.

With the microminiature image pickup device of this invention, automated assembly is also possible, and the assembly processing time can be shortened.

What is claimed is:

1. Microminiature image pickup device comprising:

image pickup element, optical glass furnished on a front surface of said image pickup element, a stacked circuit board that is furnished on a rear surface of said image pickup element and that has a wiring pattern, wherein said image pickup element is mounted to said stacked circuit board so that said rear surface is mounted on an edge of said stacked circuit board along a diametral direction, whereby length of said image pickup device in a length direction is reduced, and a connection member that electrically connects said image pickup element and the wiring pattern of said stacked circuit board;

said stacked circuit board being formed with insulated circuit boards, in which are packaged electronic circuits that include wiring patterns, stacked in multiple layers in the diametral direction perpendicular to the length direction of the microminiature image pickup device and having a cavity formed as an indentation in the diametral direction thereof;

a first electronic component mounted in said cavity, and a second electronic component mounted on the surface of said stacked circuit board.

2. Microminiature image pickup device described in claim 1 wherein said first electronic component is connected to a wiring pattern formed on the bottom surface of said cavity.

3. Microminiature image pickup device described in claim 1 wherein said first electronic component is mounted in said cavity in a bare chip state.

4. Microminiature image pickup device described in claim 1 wherein said image pickup device is a CCD device.

5. Microminiature image pickup device described in claim 1 wherein said connection member is TAB tape.

6. Microminiature image pickup device described in claim 2 wherein said first electronic component is mounted in said cavity in a bare chip state.

7. Microminiature image pickup device described in claim 2 wherein said image pickup device is a CCD device.

8. Microminiature image pickup device described in claim 3 wherein said image pickup device is a CCD device.

9. Microminiature image pickup device described in claim 2 wherein said connection member is TAB tape.

10. Microminiature image pickup device described in claim 3 wherein said connection member is TAB tape.

11. Microminiature image pickup device described in claim 4 wherein said connection member is TAB tape.

12. Microminiature image pickup device described in claim 1 wherein said device is an endoscope.

13. Microminiature image pickup device described in claim 12 wherein said device is an endoscope.

14. Microminiature image pickup device described in claim 1 wherein said stacked circuit board has a height in said diametral direction substantially equal to a size of said rear surface where said stacked circuit board meets said rear surface, said height reduced in size at other points along said length direction.

15. Microminiature image pickup device described in claim 2 wherein said stacked circuit board has a height in said diametral direction substantially equal to a size of said rear surface where said stacked circuit board meets said rear surface, said height reduced in size at other points along said length direction.

16. Microminiature image pickup device described in claim 12 wherein said stacked circuit board has a height in said diametral direction substantially equal to a size of said rear surface where said stacked circuit board meets said rear surface, said height reduced in size at other points along said length direction.

17. Microminiature image pickup device described in claim 13 wherein said stacked circuit board has a height in said diametral direction substantially equal to a size of said rear surface where said stacked circuit board meets said rear surface, said height reduced in size at other points along said length direction.

\* \* \* \* \*